US009832898B2

(12) United States Patent
Hsieh et al.

(10) Patent No.: US 9,832,898 B2
(45) Date of Patent: Nov. 28, 2017

(54) MODULAR USB FLASH DRIVES WITH REPLACEABLE HOUSINGS

(71) Applicant: PNY Technologies, Inc., Parsippany, NJ (US)

(72) Inventors: Tai-Kao Hsieh, Zhubei (TW); Hen-An Chen, Zhubei (TW); Ching-Ting Chang, Zhubei (TW)

(73) Assignee: PNY Technologies, Inc., Parsippany, NJ (US)

( * ) Notice: Subject to any disclaimer, the term of this patent is extended or adjusted under 35 U.S.C. 154(b) by 0 days.

(21) Appl. No.: 14/943,222

(22) Filed: Nov. 17, 2015

(65) Prior Publication Data

US 2016/0081213 A1 Mar. 17, 2016

Related U.S. Application Data

(63) Continuation of application No. 14/079,943, filed on Nov. 14, 2013, now Pat. No. 9,202,159.

(30) Foreign Application Priority Data

May 15, 2013 (TW) .............................. 102209027 U

(51) Int. Cl.
  *G06F 1/16* (2006.01)
  *H05K 5/02* (2006.01)
  *G06K 19/077* (2006.01)
  *G06K 19/00* (2006.01)

(52) U.S. Cl.
  CPC ..... *H05K 5/0278* (2013.01); *G06K 19/07732* (2013.01); *G06K 19/005* (2013.01)

(58) Field of Classification Search
  CPC ..................................................... G06F 1/183
  See application file for complete search history.

(56) References Cited

U.S. PATENT DOCUMENTS

| 8,837,134 | B2 * | 9/2014 | Huang .................. G06F 1/1613 312/223.2 |
| 2005/0157462 | A1 * | 7/2005 | Sugawara ........ G06K 19/07732 361/679.32 |
| 2009/0147460 | A1 * | 6/2009 | Kung ................... G06K 7/0013 361/679.31 |
| 2011/0228467 | A1 * | 9/2011 | Mitsuhashi ............ H05K 1/117 361/679.32 |

OTHER PUBLICATIONS

Notice of Allowance dated Aug. 7, 2015, from issued U.S. Pat. No. 9,202,159 (7 pages).
Office Action dated Apr. 14, 2015, from issued U.S. Pat. No. 9,202,159 (8 pages).

\* cited by examiner

*Primary Examiner* — Anthony Q Edwards
(74) *Attorney, Agent, or Firm* — McCarter & English, LLP

(57) ABSTRACT

A USB flash drive, comprising a housing comprising internal walls defining a receiving space, at least one of the internal walls having an engagement component, a memory main body disposed in the receiving space and comprising a hook slot component, and a fastener disposed in the receiving space comprising a protrusion component and a hook component, the hook component engaged with the hook slot component of the memory main body, and the protrusion component engaged with the engagement component of the housing, thereby fastening the memory main body to the housing.

12 Claims, 2 Drawing Sheets

MODULAR USB FLASH DRIVES WITH REPLACEABLE HOUSINGS

CROSS-REFERENCE TO RELATED APPLICATIONS

This application is a continuation of U.S. patent application Ser. No. 14/079,943, filed on Nov. 14, 2013, now U.S. Pat. No. 9,202,159 which claims the benefit of Taiwan Utility Model Application Serial No. 102209027 filed on May 15, 2013, the entire disclosures of which are expressly incorporated herein by reference.

BACKGROUND

Field of the Disclosure

The present disclosure relates generally to an electronic component. More specifically, the present disclosure relates to a modular USB flash drive with a replaceable housing.

Related Art

USB (Universal Serial Bus) is an electrical connector interface used for information transmission between a first and second electronic device. Currently, the most commonly available USB connector interface meeting USB 2.0 specifications has a maximum information transmission rate of 480 Mbps (megabits per second). However, due to the development of digital technologies and gradual increase in the amount of available digital information, transmission rate needs have become more demanding. Consequently, the USB 2.0 specification is increasingly inadequate to meet the electronic and digital needs of modern users. As a result, a USB connector interface has been developed with a transmission rate of 4.8 Gbps (gigabits per second) meeting USB 3.0 specifications.

Due to current construction designs of many USB flash drives, when a new USB 3.0 flash drive structure is needed (e.g., for a new product, new appearance, etc.), it is necessary to create new molds and redesigns for the electronic and structural components associated therewith, which increases manufacturing costs. For example, some portable USB 3.0 flash drive structures directly connect a memory card to a rear cover and connect end connecting pins directly to the main body, so that when a new USB flash drive structure is needed new molds and redesigns for the memory, rear cover, and connection structures related thereto are required.

SUMMARY

The present disclosure provides a USB flash drive comprising a housing, a memory main body, and a fastener. The flash drive has the memory main body fastened in the housing by a protrusion component and a hook component. This makes it possible to assemble a new flash drive (e.g., USB 3.0 flash drive) by only replacing the housing (e.g., for a new product and/or appearance and/or modifications thereof) without altering the structures of the memory main body or the fastener. This reduces production costs, such as manufacturing costs associated with new molds and redesigns (e.g., for the memory card and connection structures related thereto).

The housing has a connection port, internal walls, and a receiving space defined by the internal walls. The internal wall includes an engagement component. A memory main body is disposed in the receiving space and includes a hook slot component, a memory unit, a plurality of front terminals electrically connected to the memory unit and located near the connection port, and a plurality of rear terminals electrically connected to the memory unit and located away from the connection port and at the rear of the plurality of front terminals. A fastener is disposed in the receiving space and located on the memory main body, and has a protrusion component correspondingly fastened to the engagement component and a hook component correspondingly hooked to the hook slot component, thereby fastening the memory main body to the housing. In one embodiment, the engagement component comprises a pair of opposed slots in the housing. In another embodiment, the engagement component comprises a pair of stops formed on an inner surface of the housing.

BRIEF DESCRIPTION OF THE DRAWINGS

The foregoing features of the disclosure will be apparent from the following Detailed Description, taken in connection with the accompanying drawings, in which.

DETAILED DESCRIPTION

The present disclosure relates to a USB flash drive, as discussed below in connection with FIGS. 1-2. The USB flash drive of the present disclosure has a memory main body fastened (e.g., assembled) in a housing. This makes it possible to assemble a new flash drive, or replacing the housing (e.g., modifying the appearance or providing a new appearance) of the drive, without altering the structures of the memory main body or the fastener, thereby reducing production/manufacturing costs.

Figure 1:
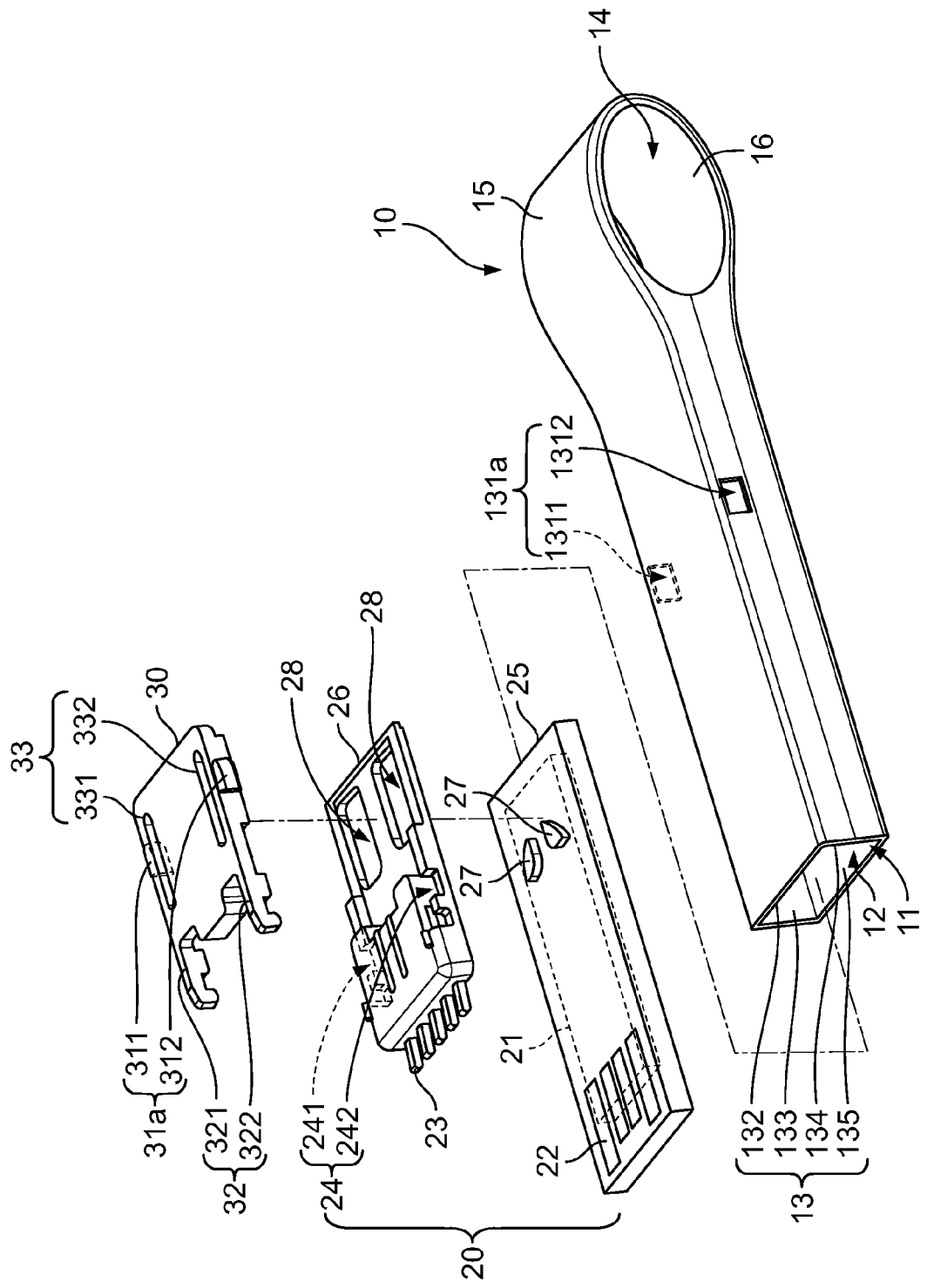
FIG. 1 is an exploded schematic view of the USB flash drive of the present disclosure.

FIG. 1 is an exploded schematic view of a USB flash drive of the present disclosure. As shown, the flash drive comprises a housing 10, a memory main body 20, and a fastener 30. The housing 10 comprises a connection port 11, a receiving space 12, internal walls 13, and an aperture 14 at an end opposite to the connection port 11.

The housing 10 is generally rectangular in shape, but could be of any shape and/or size capable of accommodating the memory main body 20 and the fastener 30. The housing 10 could be made of metallic and/or plastic material. The internal walls 13 of the housing 10 include a top surface 132, left surface 133, right surface 134, and bottom surface 135. The internal walls 13 define the receiving space 12. The engagement components 131a are disposed in the internal walls 13, and include a left slot 1311 disposed in the left surface 133, and a right slot 1312 disposed in the right surface 134.

An aperture 14 is located at an end of the housing 10 opposite the connection port 11. The aperture 14 includes an outer aperture surface 15 and inner aperture surface 16, where the inner surface 16 defines an aperture that extends from the left surface 133 of the housing 10 through the right surface 134 of the housing 10. The aperture 14, and corresponding inner aperture surface 16, are oval shaped (although any suitable shape could be used). The outer aperture surface 15 is curved and bulges outwardly from the top surface 132 and bottom surface 135 to generally conform to the oval shape of the aperture 14. This allows attachment of the USB flash drive to any number of different objects, such as by feeding a lanyard, key ring, necklace, chain, etc. through the aperture 14.

The memory main body 20 is disposed in the receiving space 12 of the housing 10. The memory main body 20 comprises a memory unit 21, a plurality of front terminals 22, a plurality of rear terminals 23, and a hook slot component 24. The plurality of front terminals 22 and the plurality of rear terminals 23 could be made of electrically conductive metal and are electrically connected to the memory unit 21 respectively. The plurality of front terminals 22 are located near the connection port 11 and could include electrically conductive terminals (e.g., four) for signals meeting USB 2.0 specification (e.g., a Vbus terminal, a D− terminal, a D+ terminal, and/or a GND terminal). The plurality of rear terminals 23 are located away from the connection port 11 and at the rear of the plurality of front terminals 22 and could include electrically conductive terminals (e.g., five) for signals meeting USB 3.0 specification (e.g., a StdA_SSRX− terminal, a StdA_SSRX+ terminal, a GND_DRAIN terminal, a StdA_SSTX− terminal, and/or a StdA_SSTX+ terminal). The prongs of the front terminals 22 and rear terminals 23 are in electrical communication with the memory unit 21.

The memory main body 20 further comprises an insulation panel 25 and an insulation plate 26 fastened to the insulation panel 25. The insulation panel 25 could be fastened to the insulation plate 26 by one or more protuberances 27 extending from a top surface of the insulation panel 25 that engage corresponding one or more holes 28 (or recesses) of the insulation plate 26. The memory unit 21 is embedded in the insulation panel 25. The plurality of front terminals 22 are embedded in the insulation panel 25 and extend through the insulation panel to the upper surface thereof. The plurality of rear terminals 23 are embedded in the insulation plate 26 and extend through the insulation panel to the upper surface thereof, and extend (or are in electrical communication with prongs that extend) towards the plurality of front terminals 22. The hook slot component 24 is located on the insulation plate 26 on the top surface opposite the insulation panel 25 and includes a left hook slot 241 and a right hook slot 242 disposed on two opposite sides (e.g., right side and left side).

The fastener 30 is disposed in the receiving space 12 and located on the memory main body 20. The fastener 30 includes a protrusion component 31a and a hook component 32. The protrusion component 31a is correspondingly fastened to the engagement component 131a of the housing 10. The hook component 32 is correspondingly hooked to the hook slot component 24 of the insulation plate 26. The protrusion component 31a comprises a left protrusion 311 correspondingly fastened to the left slot 1311 and a right protrusion 312 correspondingly fastened to the right slot 1312. More specifically, the left protrusion 311 is disposed on the fastener 30 and protrudes from a left side thereof, and the right protrusion 312 is disposed on the fastener 30 and protrudes from a right side thereof.

The hook component 32 comprises a left hook 321 correspondingly hooked to the left hook slot 241 of the insulation plate 26 and a right hook 322 correspondingly hooked to the right hook slot 242 of the insulation plate 26. The hook component 32 could have a plurality of teeth that correspondingly match and engage with the hook slot component 24. The left hook 321 and the right hook 322 separately form two parallel, downward-extending protuberances and the hooks being engaged to the left hook slot 241 and the right hook slot 242 of the memory body 20 so as to have the memory main body 20 fastened in the housing 10. When the fastener 30 engages the insulation plate 26, their corresponding geometry allows for their top surfaces to be substantially flush with one another. Further, the fastener 30 includes right groove 33 and left groove 34 relatively approximate to the right protrusion 312 and left protrusion 311, respectively. This provides flex which allows the protrusions 311, 312 to bend inwardly to allow insertion of the fastener 30 into the housing 10 for subsequent engagement with slots 1311, 1312.

Figure 2:
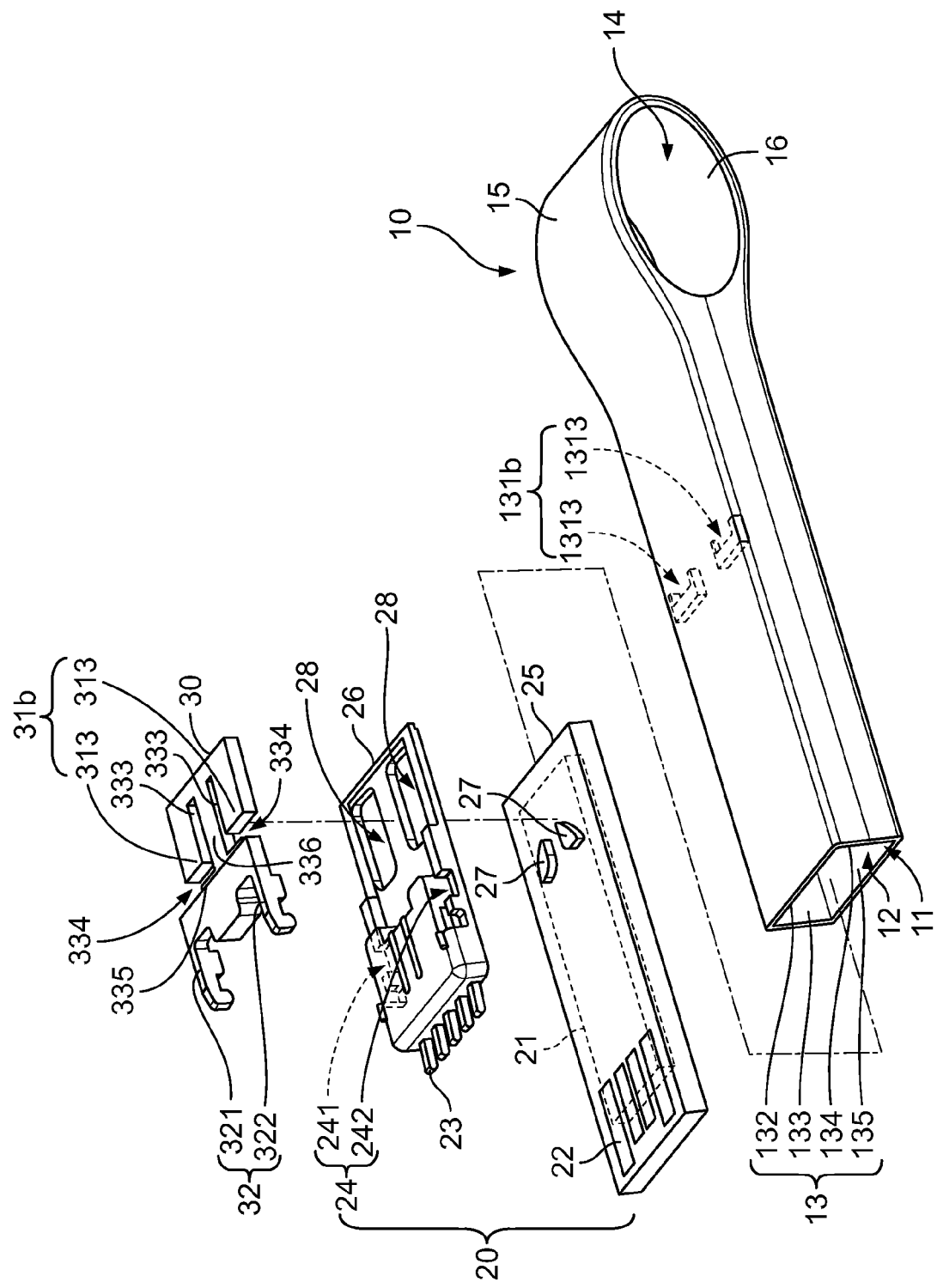
FIG. 2 is an exploded schematic view of another embodiment of the USB flash drive of the present disclosure.

FIG. 2 is an exploded schematic view of another embodiment of the USB flash drive. As shown, this embodiment includes many of the same parts and components as the flash drive of FIG. 1, except for a modified fastener and engagement component. In this embodiment, an engagement component 131b includes two upper stops 1313 disposed side by side (although a single slot could be used instead) on the top surface 132 of the internal wall 13 (although they could be disposed on the bottom surface 135 thereof). The protrusion component 31b of the fastener 30 includes two tapered protrusions 333 that are commonly connected by supporting arm 336 at an end opposite shoulder 335. The protrusion component 31b and shoulder 335 define cavities 334, and the protrusion component 31b and supporting arm 336 define grooves 333.

The protrusions 313 are tapered such that the ends of the protrusion closest to shoulder 335 are thicker than the opposite ends of the protrusions 313 (which are commonly connected by supporting arm 336). As a result, as the fastener 30 is being inserted into the housing 10, the protrusions 313 pivot away from the stops 1313 (e.g., protrusions 313 bend toward the bottom surface 135 of the housing 10, such that they are biased towards the top surface 132 of the housing 10). Once the thicker end of the protrusion 313 is past the stop 1313, the protrusions return to their initial (e.g., at rest) position, with each of the stops 1313 disposed in cavities 334 (e.g., between the shoulder 335 and the thicker end of the protrusions 313). In this way, the fastener 30 engages the housing 10, and the protrusions 313 are correspondingly fastened to the upper slots 1313.

Having thus described the system and method in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure.

The invention claimed is:

1. A USB flash drive, comprising:
a housing comprising internal walls defining a receiving space, at least one of the internal walls having a plurality of engagement components;
a memory main body disposed in the receiving space and comprising a hook slot component; and
a fastener disposed in the receiving space, the fastener including a plurality of protrusion components and a hook component, the hook component engaged with the hook slot component of the memory main body, and the plurality of protrusion components engaged with the plurality of engagement components of the housing, thereby fastening the memory main body to the housing;
wherein engagement of the plurality of protrusion components of the fastener with the plurality of engagement components of the housing prevents movement of the memory main body with respect to the housing.

2. The USB flash drive of claim 1, wherein the plurality of engagement components further comprises a plurality of slots formed in the housing.

3. The USB flash drive of claim 2, wherein the internal wall comprises a left surface and a right surface, the plurality of engagement components comprising a left slot disposed on the left surface and a right slot disposed on the right surface, the plurality of protrusion components comprising a left protrusion correspondingly fastened to the left slot and a right protrusion correspondingly fastened to the right slot.

4. The USB flash drive of claim 1, wherein the internal wall comprises a top surface and the plurality of engagement components comprises a plurality of stops extending into the receiving space from the top surface of the housing.

5. The USB flash drive of claim 4, wherein the plurality of stops are disposed side by side, and the plurality of protrusion components comprises two tapered protrusions for engaging the plurality of stops.

6. The USB flash drive of claim 1, wherein the memory main body comprises an insulation panel and an insulation plate fastened thereto.

7. The USB flash drive of claim 6, wherein the hook slot component is disposed on the insulation plate.

8. The USB flash drive of claim 6, wherein the memory main body comprises a memory unit, wherein a plurality of front terminals and rear terminals are electrically connected to the memory unit.

9. The USB flash drive of claim 8, wherein the front terminals extend through the insulation panel.

10. The USB flash drive of claim 8, wherein the front terminal comprises four electrically conductive terminals for signals meeting USB 2.0 specification.

11. The USB flash drive of claim 8, wherein the rear terminal comprises five electrically conductive terminals for signals meeting USB 3.0 specification.

12. The USB flash drive of claim 1, wherein the housing comprises a connection port and an aperture at an end opposite the connection port.

* * * * *